United States Patent
Adams et al.

(10) Patent No.: US 8,108,739 B2
(45) Date of Patent: *Jan. 31, 2012

(54) HIGH-SPEED TESTING OF INTEGRATED DEVICES

(75) Inventors: Chad A. Adams, Byron, MN (US);
Derick G. Behrends, Rochester, MN (US); Todd A. Christensen, Rochester, MN (US); Travis R. Hebig, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 920 days.

This patent is subject to a terminal disclaimer.

(21) Appl. No.: 12/110,955

(22) Filed: Apr. 28, 2008

(65) Prior Publication Data

US 2009/0271669 A1    Oct. 29, 2009

(51) Int. Cl.
*G11C 29/30* (2006.01)
*G11C 29/50* (2006.01)

(52) U.S. Cl. .......................... 714/718; 714/733
(58) Field of Classification Search .................. None
See application file for complete search history.

(56) References Cited

U.S. PATENT DOCUMENTS

| | | | |
|---|---|---|---|
| 5,826,006 A * | 10/1998 | Saitoh | 714/42 |
| 6,320,420 B1 * | 11/2001 | Shibayama | 326/95 |
| 7,038,955 B2 * | 5/2006 | Susuki et al. | 365/201 |
| 7,272,761 B2 | 9/2007 | Rich et al. | |
| 7,318,182 B2 | 1/2008 | Bushard et al. | |
| 7,783,943 B2 * | 8/2010 | Adams et al. | 714/718 |
| 2002/0049946 A1 * | 4/2002 | Tomishima et al. | 714/744 |

* cited by examiner

*Primary Examiner* — Jeffrey A Gaffin
*Assistant Examiner* — Dipakkumar Gandhi
(74) *Attorney, Agent, or Firm* — Cantor Colburn LLP

(57) ABSTRACT

A method for allowing high-speed testability of a memory device having a core with memory cells for storing data, comprising: enabling a data signal having a first logical state or a second logical state from the core to reach an output port of the memory device within an evaluate cycle during a functional operating mode and pass an array built in self test during LBIST mode; enabling the data signal to change from the first logical state to the second logical state during LBIST mode at a time that coincides with the latest possible time the data signal from the core can reach the read output port within the evaluate cycle during the functional operating mode and pass the array built in self test; and executing a logic built-in self test configured to test a logic block located downstream of a transmission path of the memory device.

21 Claims, 4 Drawing Sheets

HIGH-SPEED TESTING OF INTEGRATED DEVICES

BACKGROUND OF THE INVENTION

1. Field of the Invention

This invention relates to a system and method for allowing high-speed testability of integrated devices.

2. Description of Background

When testing integrated circuits, techniques such as ABIST (Array Built In Self Test) and LBIST (Logic Build In Self Test) are used to test memory arrays and logic respectively. It is important to be able to test the full latch-to-latch paths that are used in the chip function. Many times the latch-to-latch paths cross macro boundaries that include static random access memories (SRAMs) along with other logic.

Domino SRAMs have a feature where the access time is determined by the slowest SRAM cell unlike a sense amplifier SRAM where the access time is determined by fixed timing on the sense amp set signal. Because of this, a problem exists when testing domino SRAMs that have logic between the output of the array and a scannable capture latch. In these situations, ABIST can often only test the read path to the array boundary and a simple bypass path is used to the test the downstream logic during LBIST. Since neither ABIST nor LBIST tests the entire array and logic path simultaneously there is a test hole where AC or high-speed faults or slow SRAM cells can remain undetectable and the part (SRAM) will fail in normal functional operation. When these cases occur, architectural verification programs (AVPs) are often required to close the hold at the expense of test time and cost.

SUMMARY OF THE INVENTION

The shortcomings of the prior art are overcome and additional advantages are provided through the provision of a method for allowing high speed testability of a memory device having a core with memory cells for storing data, the method comprising: enabling a data signal having a first logical state or a second logical state from the core to reach a read output port of the memory device within an evaluate cycle during a functional operating mode and pass an array built in self test during a logical test operating mode; enabling the data signal to change from the first logical state to the second logical state during the logic test operating mode at a time that coincides with the latest possible time the data signal from the core can reach the read output port within the evaluate cycle during the functional operating mode and pass the array built in self test; and executing a logic built-in self test configured to test a logic block located downstream of a transmission path of the memory device.

The shortcomings of the prior art are overcome and additional advantages are provided through the provision of a system for allowing high-speed testability of integrated devices, the system comprising: a memory device having a read output port and a core with memory cells for storing data therein, the core and the read output port define a transmission path therebetween, a data signal having a first logical state and a second logical state generated from the core is configured to reach the read output port of the memory device within an evaluate cycle during a functional operating mode and pass an array built in self test during a logical testing operating mode; and circuitry for enabling the data signal to change from the first logical state to the second logical state during the logic test operating mode at a time that coincides with the latest possible time the data signal from the core can reach the read output port within the evaluate cycle during the functional operating mode and pass the array built in self test.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution for allowing high-speed testability of integrated devices.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
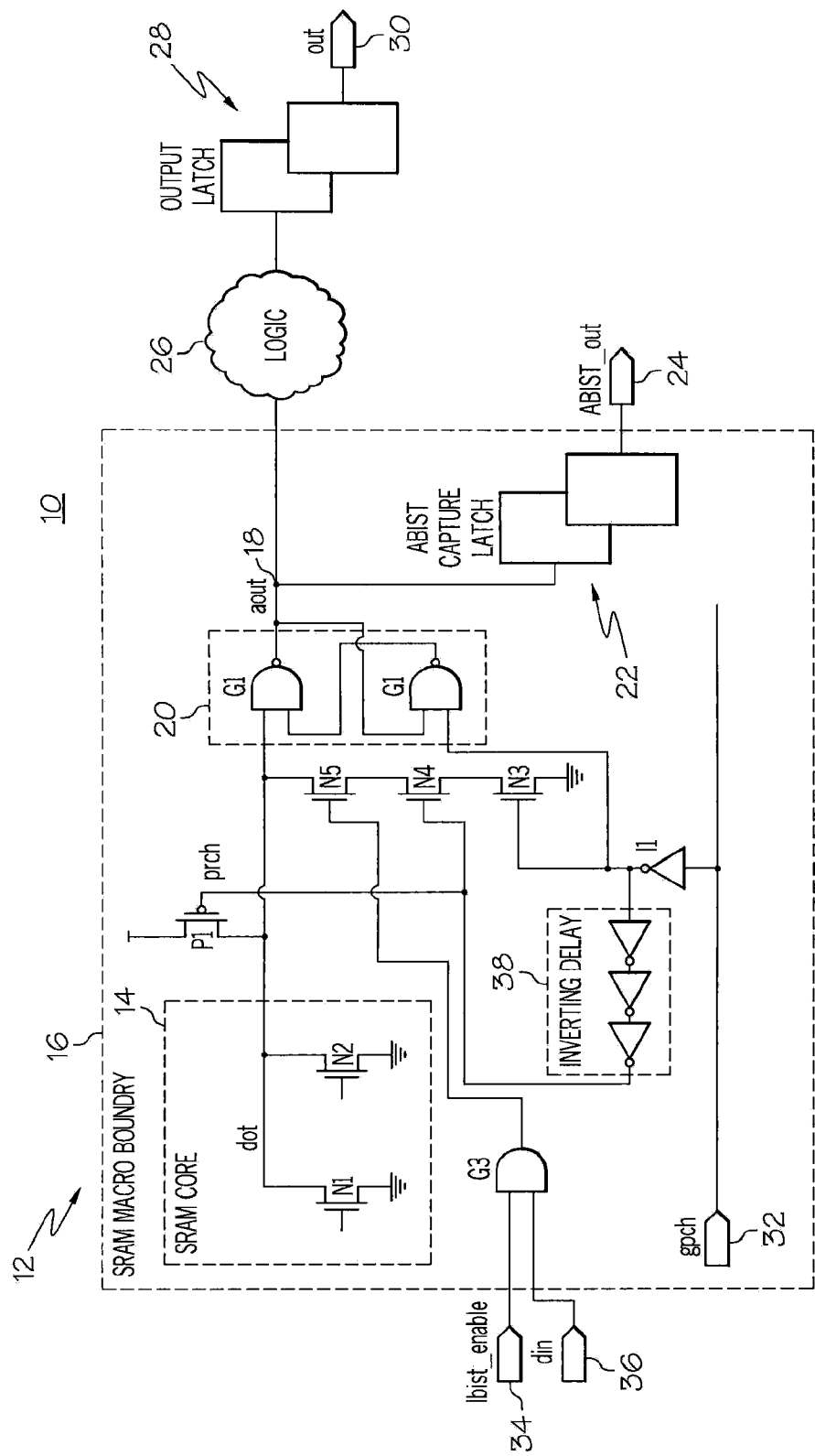
FIG. 1 is a schematic diagram illustrating a system for allowing high-speed testability of an integrated device in accordance with one exemplary embodiment of present invention.

The detailed description explains the preferred embodiments of the invention, together with advantages and features, by way of example with reference to the drawings.

DETAILED DESCRIPTION OF THE INVENTION

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known or conventional components and processing techniques are omitted so as to not necessarily obscure the present invention in detail. The examples used herein are intended merely to facilitate an understanding of ways in which the invention may be practiced and to further enable those of skill in the art to practice the invention. Accordingly, the examples should not be construed as limiting the scope of the invention.

The present inventors herein have recognized exemplary embodiments of a system and method that enables ABIST to screen slow SRAM cells and LBIST to thoroughly test for the AC or high-speed fails in the logic downstream from a memory device (e.g., domino read SRAM). Exemplary embodiments of the system and method allow the read path of the memory device to operate as usual in normal functional mode. In LBIST mode or logical test operating mode, data is launched to the downstream logic from the memory device at a time that would coincide with the slowest tolerable SRAM cell read. As such, exemplary embodiments of the system and method simulate the timing of the slowest possible SRAM cell that is allowed to pass ABIST.

It should be understood that the structure of Positive Channel Field Effect Transistors (PFETs) and Negative Channel Field Effect Transistors (NFETs) used in exemplary embodiments of the present invention in their simplest form include a gate electrode over a gate dielectric over a channel region in a semiconductor substrate with a source and a drain formed in the substrate on opposite sides of the channel region. It is contemplated that other structurally complex PFETs and NFETs as known in the art may be used in exemplary embodiments of the present invention.

Now referring to the drawings, FIG. 1 is a schematic diagram illustrating a system 10 for allowing high-speed testability of an integrated device or circuit chip in accordance with one exemplary embodiment. The system 10 comprises an integrated circuit 12, such as a memory device or standard random access memory (SRAM), having a SRAM core 14 with memory cells for storing data. In one non-limiting exemplary embodiment, the SRAM is a Domino SRAM. Of course, the SRAM can be any conventional memory device of any type and should not be limited to the example set forth above. The integrated circuit 12 has a SRAM macro boundary 16 having electrical circuitry therein for enabling the execution of an array built-in self test (ABIST) and a logic built-in self test (LBIST) in accordance with exemplary embodiments of the present invention.

During normal operating conditions, hereinafter referred to as functional mode, the SRAM core 14 launches a data signal (dot) through a transmission path of the memory device 12 and to a read output port 18 in the SRAM macro boundary 16 of the memory device 12 during a SRAM cell read. The data signal (dot) represents the logical state of the memory cell read from the SRAM core 14. The data signal (dot) can be any one of two logical states, logical state 0 or logical state 1. The SRAM core 14 includes pull-down devices N1 and N2 configured for selectively pulling down the data signal (dot).

Figure 2:
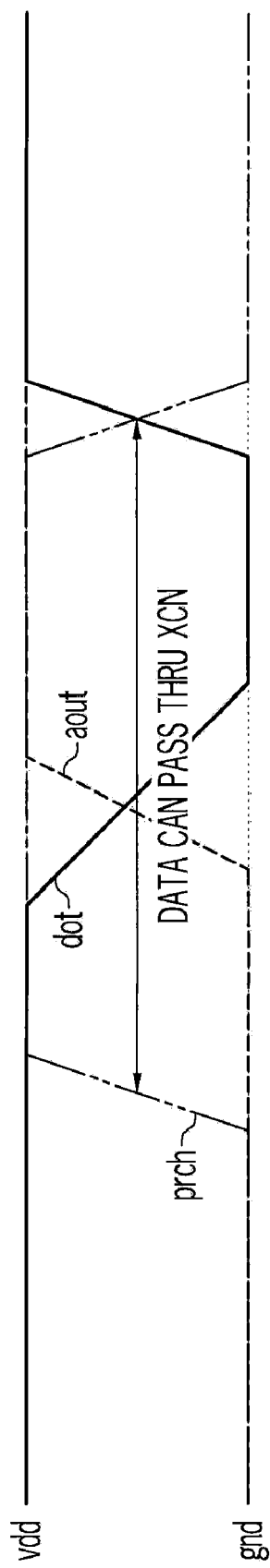
FIG. 2 is an exemplary graph illustrating the timing of data passing through a cross-coupled NAND of the system in accordance with one exemplary embodiment of present invention.
Figure 3:
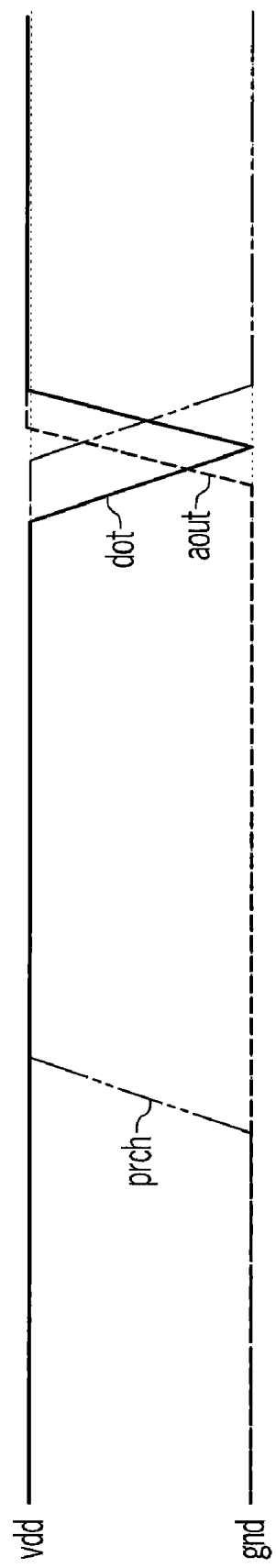
FIG. 3 is an exemplary graph illustrating the timing of data passing through a cross-coupled NAND of the system at a time that would coincide with the slowest tolerable SRAM cell read in accordance with one exemplary embodiment of present invention.

In accordance with one exemplary embodiment, the data signal (dot) passes through a cross-coupled NAND 20 comprising logic gates G1 and G2. The data signal (dot) being sent through the cross-coupled NAND is illustrated in FIGS. 2-3. The cross-coupled NAND 20 is coupled between the SRAM core 14 and the read output port 18 and is within the SRAM macro boundary 16 in accordance with one exemplary embodiment. The cross-coupled NAND 20 is configured to selectively change or hold the state of the signal read out from the read output port 18. The signal being read out from the read output port 18 is indicated by an output signal (aout). The output signal (aout) is the inverse of data signal (dot).

In accordance with one exemplary embodiment, an ABIST capture latch 22 receives the signal (aout) and is read out from an ABIST output pin 24. The ABIST capture latch 22 enables the execution of ABIST to screen slow SRAM cells. In ABIST, it is determined whether the data signal (dot) passed through the cross-coupled NAND 20 and reached the read output port 18 during an evaluate phase or cycle, which will be described in more detail below. The data signal (dot) passes ABIST if it reaches the read output port 18. In addition, a logic block 26 located downstream the SRAM macro boundary 16 is configured to receive the output signal (aout). The output signal (aout) can be used to perform logic operations within the logic block 26. The output of the logic block 26 can be latched in an output latch 28 and read out from an output pin 30 accordingly. In accordance with one exemplary embodiment, LBIST is executed in the logic block 26 to test the same.

In accordance with one exemplary embodiment, the system also operates in a logic test operating mode, hereinafter referred to as LBIST mode, where data is launched to the downstream logic or the data signal (dot) is changed from one state to another at a time that coincides with the latest possible time that the data signal (dot) from the SRAM core 14 can reach the read output port 18 during functional mode and pass ABIST as shown in FIG. 3. This time would coincide with the slowest tolerable SRAM cell read. In other words, during LBIST mode, the system simulates the timing of the slowest possible SRAM cell that is allowed to pass ABIST. Advantageously, the full transmission path between the SRAM core 14 and the logic block 26 is tested. This ensures that LBIST will find all AC or high-speed fails in downstream logic.

Now turning to further details of the system 10. The SRAM macro boundary 16 further includes a global pre-charger indicated by an input pin 32 for initiating the evaluate phase by sending a global pre-charge signal (gpch) to a pre-charging device P1 coupled to the transmission path of the data signal (dot) as shown. The SRAM macro boundary 16 further includes transistors N3-N5 that control the operations of the cross-coupled NAND 20. The transistors N3-N5 enable the cross-coupled NAND 20 to change or hold the state of the signal read out from the read output port 18. In accordance with one exemplary embodiment, the transistor N3-N5 selectively pull the data signal (dot) low at the latest possible time before the evaluate phase ends. In accordance with one exemplary embodiment, the transistors N3-N5 are serially connected with one another to a ground. In accordance with one non-limiting exemplary embodiment, transistors N3-N5 are NFETs. Of course, other structurally complex NFETs as known in the art may be used in exemplary embodiments of the present invention.

In accordance with one exemplary embodiment, the data signal (dot) can pass through the cross-coupled NAND (XCN) 20 at any time during the evaluate phase or when the global pre-charge signal (gpch) is high or a logical 1 as illustrated in FIG. 2. In this phase, the cross-coupled NAND 20 is transparent. Thus, data signal (dot) falling causes signal (aout) to rise and data signal (dot) staying high causes output signal (aout) to stay low during the evaluate phase. The global pre-charge signal (gpch) also enables the pre-charging device P1, which is a PFET in accordance with one exemplary embodiment, to bring the data signal (dot) high when the global pre-charge signal (gpch) is low or a logical 0. In other words, when the global pre-charge signal (gpch) is low the pre-charging device P1 pre-charges the data signal (dot) high. Thus, the data signal (dot) can pass through the cross-coupled NAND 20 without getting pre-charged only during the evaluate phase or when global pre-charge signal (gpch) is high.

An inverting device 11 is coupled between the gate of transistor N3 and the global pre-charger 32 in accordance with one exemplary embodiment. As a result, transistor N3 is controlled by the inverse of the global pre-charge signal (gpch). In operation, when the global pre-charge signal (gpch) is low, transistor N3 is turned on and when the global pre-charge signal (gpch) is high, transistor N3 is effectively turned off. The output of a logical AND gate G3 is coupled to the gate of transistor N5 for controlling the same. The logical AND gate G3 operably receives an LBIST_enable signal (lbist_enable) and a data input signal (din) from an LBIST enable input pin 34 and a data input pin 36 respectively. As such, transistor N5 is turned on when both signals (lbist_enable and din) are high. The LBIST_enable signal (lbist_enable) enables LBIST to test for AC fails in the logic downstream from the memory device. The data input signal (din) is launched to the downstream logic at a time that would coincide with the slowest tolerable SRAM cell read as discussed above. Having lbist_enable and din both high simulates reading a logical 0 from the slowest possible SRAM cell that will pass ABIST. However, when either signal (lbist_enable and din) is low, the system operates in functional mode.

An inverting delay mechanism 38 is coupled between inverting device 11 and the gate of transistor N4. The inverting delay mechanism 38 comprises of a plurality of inverters sized to provide just enough delay for the cross-coupled NAND 20 to switch the state of the read output port 18 as the data signal (dot) passes therethrough before the end of the evaluate phase.

In functional mode, lbist_enable is low causing transistor N5 to be turned off. This disables the effect of the transistor devices N3 and N4. In operation, the global pre-charge signal (gpch) goes high to begin the evaluate phase. In this phase, the cross-coupled NAND is transparent and data signal (dot) can pass through it at any time as shown in FIG. 2. During this phase, data signal (dot) failing causes output signal (aout) to rise and data signal (dot) staying high causes output signal (aout) stay low. When global pre-charge signal (gpch) goes low, data signal (dot) is pre-charged high and the cross-coupled NAND 20 is made opaque to hold the state of output signal (aout).

In LBIST mode, the pull-down devices N1 and N2 in the SRAM core 14 must not pull down data signal (dot). This is prevented by not activating the word-line in the SRAM core 14 or by inserting a transmission gate in the transmission path of the data signal (dot) to disconnect the pull-down devices from the input of the cross-coupled NAND 20. In LBIST mode, LBIST_enable signal (lbist_enable) is high. When data input signal (din) is low, the system operates the same as in functional mode because passing a logical 1 happens at the beginning of the evaluate phase in functional mode. Having LBIST_enable signal (lbist_enable) and data input signal (din) high simulates reading a logical 0 from the slowest possible SRAM cell that will pass ABIST. In operation, when global pre-charge signal (gpch) goes high, the evaluate phase begins. Transistor N3 is turned off and after a delay transistor N4 is turned on. At this time, data signal (dot) is not affected. Also, transistor N5 is turned on since both signals (bist_enable and din) are high. Data signal (dot) is only affected when global pre-charge signal (gpch) falls or goes low. When global pre-charge signal falls, transistor N3 is turned on causing all three NFETs (N3, N4 and N5) to all be turned on simultaneously. This discharges data signal (dot) to ground. In other words, transistors N3, N4, and N5 pull the data signal (dot) low when they are all turned on before it passes through the cross-coupled NAND 20. Then after a delay determined by the inverting delay mechanism 38, transistor N4 turns off and pre-charger P1 pre-charges the data signal (dot). Now, all three NFETs are no longer all turned on. This ends the evaluate phase and data signal (dot) is high. As such, the state of data signal (dot) changes at the latest possible time before it is pre-charged as shown in FIG. 3, thus effectively passing ABIST. This ensures that LBIST performed on the logic block 26 will find all high-speed fails. In accordance with one exemplary embodiment, the timing of the global pre-charge signal in LBIST mode is identical to functional mode.

Figure 4:
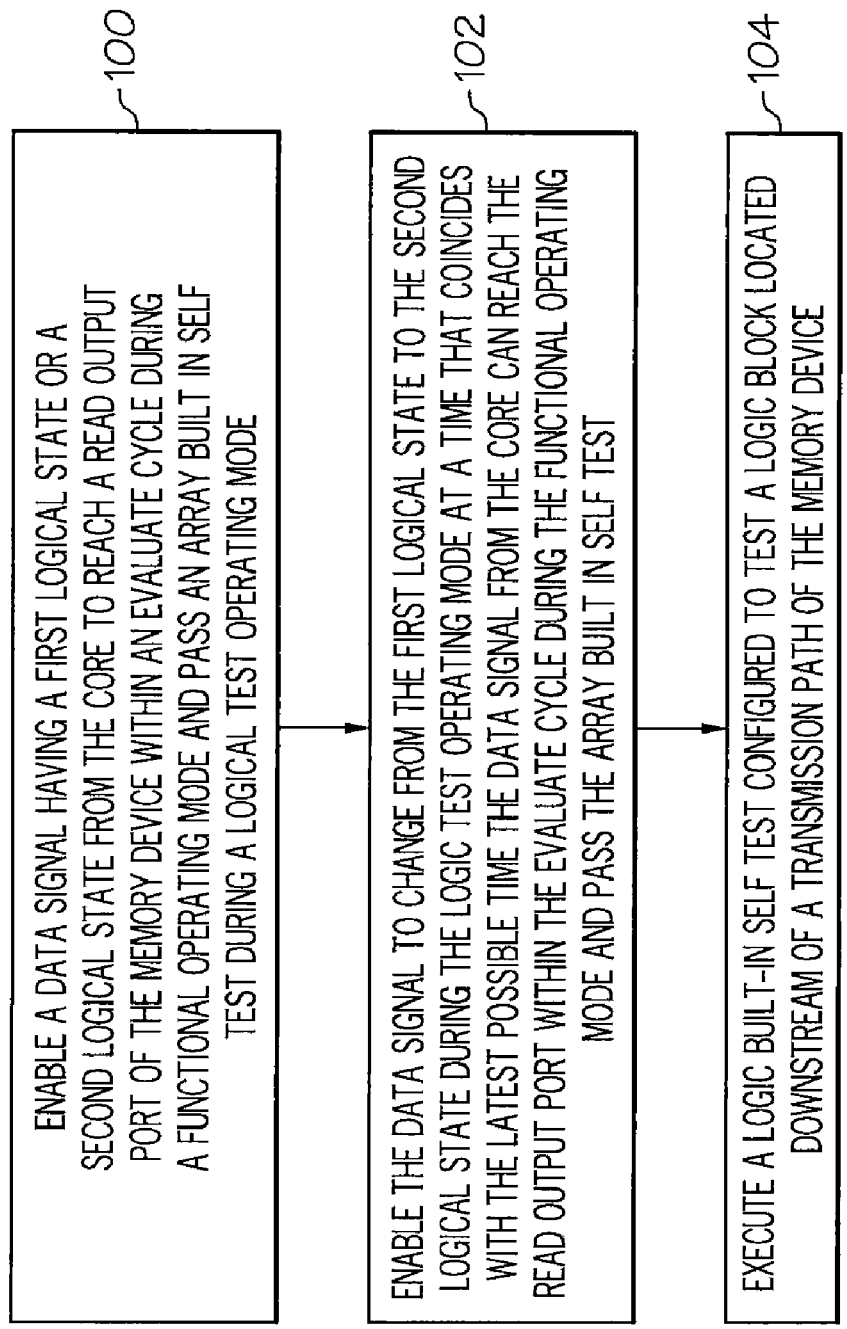
FIG. 4 is a flow diagram illustrating a method for allowing high speed testability of a memory device having a core with memory cells for storing data in accordance with one exemplary embodiment of present invention.

In accordance with an exemplary embodiment of the present invention, an exemplary method for allowing high speed testability of a memory device having a core with memory cells for storing data is provided and illustrated in FIG. 4. In this exemplary method, enable a data signal having a first logical state or a second logical state from the core to reach a read output port of the memory device within an evaluate cycle during a functional operating mode and pass an array built in self test during a logical test operating mode in operational block 100. Next, enable the data signal to change from the first logical state to the second logical state during the logic test operating mode at a time that coincides with the latest possible time the data signal from the core can reach the read output port within the evaluate cycle during the functional operating mode and pass the array built in self test in operation block 102. In block 104, execute a logic built-in self test configured to test a logic block located downstream of a transmission path of the memory device.

Advantageously, exemplary embodiments of the present invention enables data to be launched to the downstream logic at a time that would coincide with the slowest tolerable SRAM cell read during the functional operating mode and pass ABIST. As such, the full latch-to-latch paths that are used in the chip function are tested.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for allowing high-speed testability of a memory device having a core with memory cells for storing data, the method comprising:

enabling a data signal having a first logical state or a second logical state from the core to reach a read output port of the memory device within an evaluate cycle during a functional operating mode and pass an array built in self test during a logical test operating mode;

enabling the data signal to change from the first logical state to the second logical state during the logic test operating mode at a time that coincides with the latest possible time the data signal from the core can reach the read output port within the evaluate cycle during the functional operating mode and pass the array built in self test; and executing a logic built-in self test configured to test a logic block located downstream of a transmission path of the memory device.

2. The method as in claim 1, wherein the memory device includes a cross-coupled NAND coupled between the core and the read output port, the cross-coupled NAND selectively changes the state of the read output port based on the data signal.

3. The method as in claim 2, wherein the data signal is configured to change from the first logical state to the second logical state before reaching the cross-coupled NAND during the logic operating mode.

4. The method as in claim 1, wherein a pre-charging mechanism is configured to operate in a first operational state or a second operational state to respectively enable or disable the data signal from the core to reach the read output port of the memory device during the functional operating mode.

5. The method as in claim 4, wherein a global pre-charging signal controls the pre-charging mechanism to operate in the first operational state or the second operational state, the global pre-charging signal is configured to begin the evaluate cycle and end the evaluate cycle.

6. The method as in claim 5, wherein the memory device includes a first transistor, a second transistor, and a third transistor each configured for enabling the data signal to change from the first logical state to the second logical state within the evaluate cycle during the logic operating mode.

7. The method as in claim 6, wherein the first transistor, the second transistor, and the third transistor are coupled in series with one another and a ground, the data signal changes from the first logical state to the second logical state during the logic test operating mode when the first transistor device, the second transistor device, and the third transistor device are each turned on simultaneously.

8. The method as in claim 6, wherein a logical gate is coupled to the first transistor, the logical gate is configured to control the operations of the first transistor based on a data input signal and a logic test enable signal that turns on the logic operating mode.

9. The method as in claim 6, wherein the global pre-charge signal is coupled to the second transistor and the third transistor, the global pre-charge signal controls the operations of the second transistor and the third transistor.

10. The method as in claim 9, wherein a delay mechanism is coupled between the global pre-charge signal and the second transistor, the delay mechanism is configured to provide an operational delay such that the data signal changes from the first logical state to the second logical state during the logic operating mode during the time that coincides with the latest possible time the data signal from the core can reach the read output port within the evaluate cycle during the functional operating mode and pass the array build in self test.

11. The method as in claim 10, wherein the delay mechanism comprises a plurality of inverting devices.

12. A system for allowing high-speed testability of integrated devices, the system comprising:
    a memory device having a read output port and a core with memory cells for storing data therein, the core and the read output port define a transmission path therebetween, a data signal having a first logical state and a second logical state generated from the core is configured to reach the read output port of the memory device within an evaluate cycle during a functional operating mode and pass an array built in self test during a logical testing operating mode; and
    circuitry for enabling the data signal to change from the first logical state to the second logical state during the logic test operating mode at a time that coincides with the latest possible time the data signal from the core can reach the read output port within the evaluate cycle during the functional operating mode and pass the array built in self test.

13. The system as in claim 12, wherein a cross-coupled NAND is coupled between the core and the read output port, the cross-coupled NAND selectively changes the state of the read output port based on the data signal.

14. The system as in claim 13, wherein the data signal is configured to change from the first logical state to the second logical state before reaching the cross-coupled NAND during the logic operating mode.

15. The system as in claim 12, wherein a pre-charging mechanism is coupled in the transmission path, the pre-charging mechanism is configured to operate in a first operational state or a second operational state to respectively enable or disable the data signal from the core to reach the read output port of the memory device during the functional operating mode.

16. The system as in claim 15, wherein a global pre-charging signal controls the pre-charging mechanism to operate in the first operational state or the second operational state, the global pre-charging signal is configured to begin the evaluate cycle and end the evaluate cycle.

17. The system as in claim 15, wherein the memory device includes a first transistor, a second transistor, and a third transistor each configured for enabling the data signal from changing from the first logical state to the second logical state within the evaluate cycle during the logic operating mode.

18. The system as in claim 17, wherein the first transistor, the second transistor, and the third transistor are coupled in series with one another and a ground, the data signal changes from the first logical state to the second logical state during the logic test operating mode when the first transistor device, the second transistor device, and the third transistor device are each turned on simultaneously.

19. The system as in claim 17, wherein a logical gate is coupled to the first transistor, the logical gate is configured to control the operations of the first transistor based on a data input signal and a logic test enable signal that turns on the logic operating mode.

20. The system as in claim 17, wherein the global pre-charge signal is coupled to the second transistor and the third transistor, the global pre-charge signal controls the operations of the second transistor and the third transistor.

21. The system as in claim 20, wherein a delay mechanism is coupled between the global pre-charge signal and the second transistor, the delay mechanism is configured to provide an operational delay such that the data signal changes from the first logical state to the second logical state during the logic operating mode during the time that coincides with the latest possible time the data signal from the core can reach the read output port within the evaluate cycle during the functional operating mode and pass the array build in self test.

* * * * *